(12) United States Patent  (10) Patent No.: US 6,533,375 B2
Fulterer et al.  (45) Date of Patent: Mar. 18, 2003

(54) MOTORIZED PULL-OUT DEVICE

(75) Inventors: Manfred Fulterer, Lustenau (AT); Augustin Rauch, Schnifis (AT)

(73) Assignee: Fulterer Gesellschaft m.b.H., Lustenau (AT)

( * ) Notice: Subject to any disclaimer, the term of this patent is extended or adjusted under 35 U.S.C. 154(b) by 0 days.

(21) Appl. No.: 09/782,348

(22) Filed: Feb. 12, 2001

(65) Prior Publication Data

US 2001/0013745 A1 Aug. 16, 2001

(30) Foreign Application Priority Data

Feb. 14, 2000 (AT) .......................................... A 215/2000

(51) Int. Cl.⁷ .............................................. A47B 88/00
(52) U.S. Cl. ................................. 312/319.8; 312/330.1; 250/221
(58) Field of Search ........................... 312/319.5, 319.7, 312/319.8, 319.9, 330.1, 319.6, 201, 198; 250/227.22, 227.21, 221; 340/456, 686.1, 686.3

(56) References Cited

U.S. PATENT DOCUMENTS

| | | | | |
|---|---|---|---|---|
| 3,028,209 A | * | 4/1962 | Hinkel et al. | 312/319.7 |
| 4,299,251 A | * | 11/1981 | Dugas | 250/227.22 X |
| 4,759,592 A | * | 7/1988 | Dahnert | 312/201 |
| 4,783,618 A | * | 11/1988 | Artrip | 312/201 X |
| 4,852,932 A | * | 8/1989 | Koneya et al. | 312/330.1 X |
| 5,087,107 A | * | 2/1992 | Fumanelli | 312/319.5 X |
| 5,417,487 A | * | 5/1995 | Dahnert | 312/201 |
| 5,670,778 A | * | 9/1997 | Smith | 312/201 X |
| 5,975,662 A | * | 11/1999 | Weber | 312/319.9 |
| 6,091,064 A | * | 7/2000 | Eaton et al. | 250/221 |
| 6,130,621 A | * | 10/2000 | Weiss | 312/319.8 X |
| 6,222,179 B1 | * | 4/2001 | Mikan | 250/221 |

FOREIGN PATENT DOCUMENTS

| | | | | |
|---|---|---|---|---|
| DE | 2329342 | * | 1/1975 | 312/201 |
| DE | 3021363 | | 12/1981 | |
| DE | 8912722 | | 1/1990 | |
| EP | 0098195 | * | 1/1984 | 312/319.5 |
| GB | 2133782 | | 8/1984 | |
| GB | 2328781 | | 3/1999 | |
| JP | 03161668 | * | 7/1991 | 312/333 |

* cited by examiner

*Primary Examiner*—Lanna Mai
*Assistant Examiner*—Hanh V. Tran
(74) *Attorney, Agent, or Firm*—Sildey Austin Brown & Wood, LLP

(57) ABSTRACT

A motorized pull-out device for a tall cupboard and including a motor for pulling out the pull-out rail connected with the pull-out section of the tall cupboard and for driving the pull-out rail in a switch for actuating the motor, and an arrangement for actuating the switch and including a light reflector for reflecting the light emitted by the light source onto the light receiver and associated with the pull-out section of the tall cupboard, and an actuation member for displacing the light reflector between a first and second positions, in which the light emitted by the light source is either reflected or not reflected by the light reflector, onto the light receiver, respectively.

8 Claims, 4 Drawing Sheets

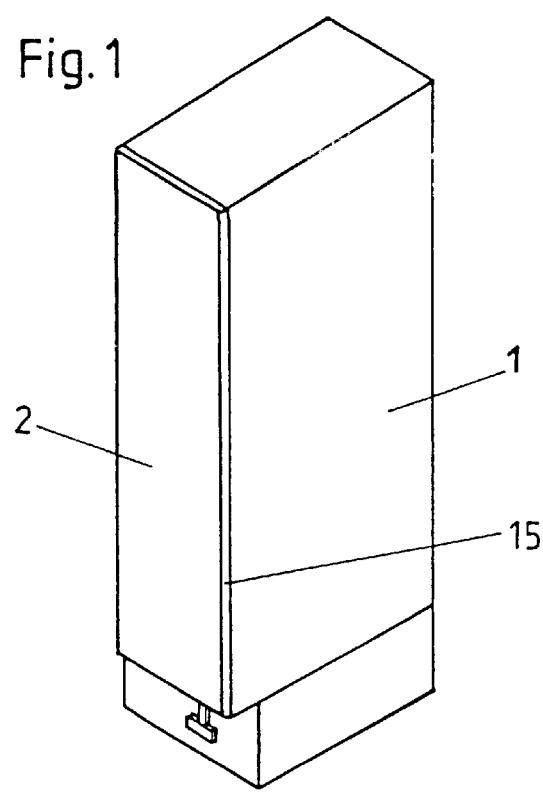
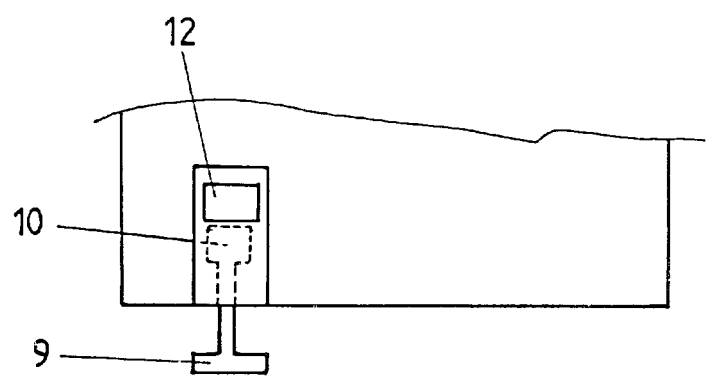
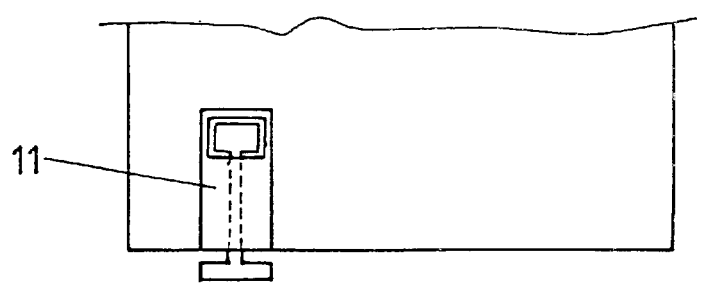

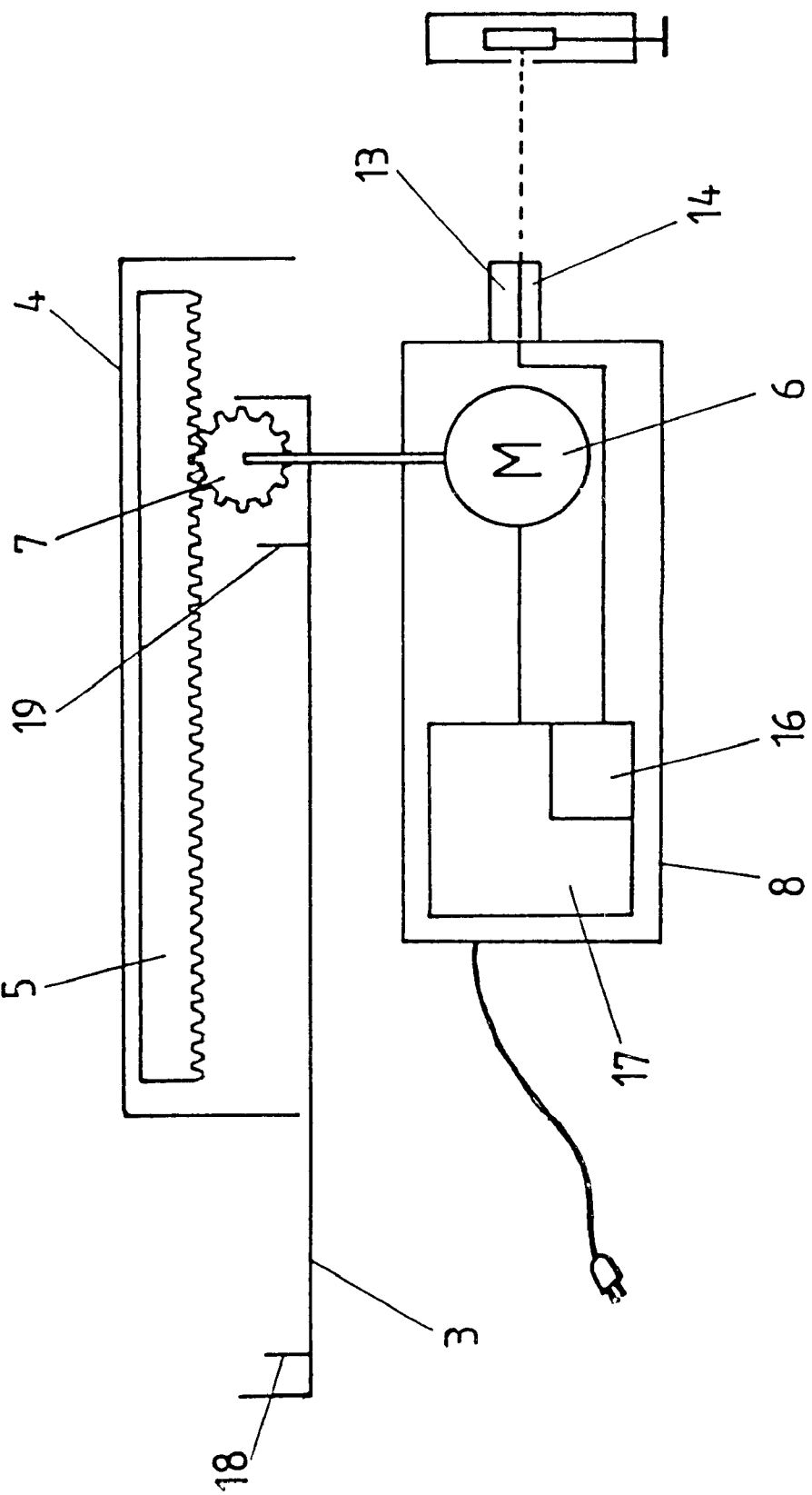

MOTORIZED PULL-OUT DEVICE

BACKGROUND OF THE INVENTION

1. Field of Invention

The present invention relates to a motorized pull-out device for a tall cupboard having a pull-out section, with the pull-out device including a pull-out rail connected with the pull-out section of the tall cupboard, a motor for pulling the pull-out rail out and for driving the pull-out rail in, a control unit for controlling operation of the motor, and a switch for actuating the motor for effecting pulling the pull-out section of the tall cupboard out and driving the pull-out section in.

2. Description of the Prior Art

Motor-driven pull-out devices are usually used with pull-out sections, which carry relatively large loads, in order to facilitate their displacement. In particular, such devices are used for moving drawer sections of tall cupboards. Such pull-out devices can, however, also be used for moving drawers or boxes, which are filled with heavy objects, e.g., tools, of work benches.

With the known motor-driven pull-out devices of the above-described type, the actuation is effected with a switch stirrup arranged in a base of a tall cupboard housing or frame and actuated by a foot of a user. Upon a first touch of the stirrup, the pull-out section or drawer is pull-out completely. Upon a further touch, the drawer or the pull-out section is driven-in. A drawback of this arrangement consists in that with the pulled-out drawer, the switch stirrup becomes accessible only with much difficulty. From the front, actuation of the stirrup is practically impossible. In order to actuate the switch stirrup, the user should try to reach it from the side. However, the sidewise accessibility in many cases is very difficult, e.g., when several tall cupboards are arranged side by side.

German Publication DE 23 29 342A1 discloses a control device for a cupboard displaceable on rails. For controlling the displacement, there is provided a light sender-light receiver unit. In this way, with the control unit of DE 23 29 342A1, no multiwire hanging cable is necessary for displacing the cupboard. However, power feed to the separate cupboards is still necessary. The power, however, can be fed via the support rails or via a separate conductor rail.

An object of the present invention is to provide a pull-out device of the above-described type which is user-friendly, can be easily secured to a cupboard or similar item, and requires little maintenance.

SUMMARY OF THE INVENTION

This and other objects, of the present invention, which will become apparent hereinafter, are achieved by providing means for actuating the switch and that includes a light source, a light receiver, a light reflector for reflecting the light emitted by the light source onto the light receiver and associated with the pull-out section of the tall cupboard, and an actuation member for displacing the light reflector between a first position, in which the light emitted by the light source is reflected by the light reflector onto the light receiver, and a second position in which the light emitted by the light source is not reflected by the light receiver onto the light receiver.

With the switch-actuating means according to the present invention, the actuation member can be mounted, e.g., on the pull-out section, a tool box or a pull-out section of a tall cupboard. Advantageously, the actuation member is mounted on the front cover of the pull-out item and is preferably secured to the bottom of the pull-out section or box. This insures easy accessibility of the actuation member even with the pull-out section, drawer or box, being pulled-out. The actuation member is accessible, with the drawer or box being pulled out, both from the front and from the side. With the pull-out device according to the present invention, no cable, which would extend to the pull-out section, is necessary. Extending the cable to the pull-out section would have been associated with high manufacturing costs and a relatively high wear because of permanent bending loads applied to the cable. Further, with the pull-out device according to the present invention, no power source is arranged in the pull-out section which would have required additional maintenance or its replacement upon its exhaustion.

The novel features of the present invention, which are considered as characteristic for the invention, are set forth in the appended claims. The invention itself, however, both as to its construction and its mode of operation, together with additional advantages and objects thereof, will be best understood from the following detailed description of preferred embodiments, when read with reference to the accompanying drawings.

BRIEF DESCRIPTION OF THE DRAWINGS

The drawings show:

FIG. 1 a perspective view of a motorized tall cupboard according to the present invention;

FIG. 3 an elevational view from inside a section of drawer in one of switch positions of the actuation member;

FIG. 4 a view similar to that of FIG. 3 in another of switch positions of the actuation member;

FIG. 5 a schematic principal diagram of a pull-out device according to the present invention;

DETAILED DESCRIPTION OF THE PREFERRED EMBODIMENT

Figure 2:
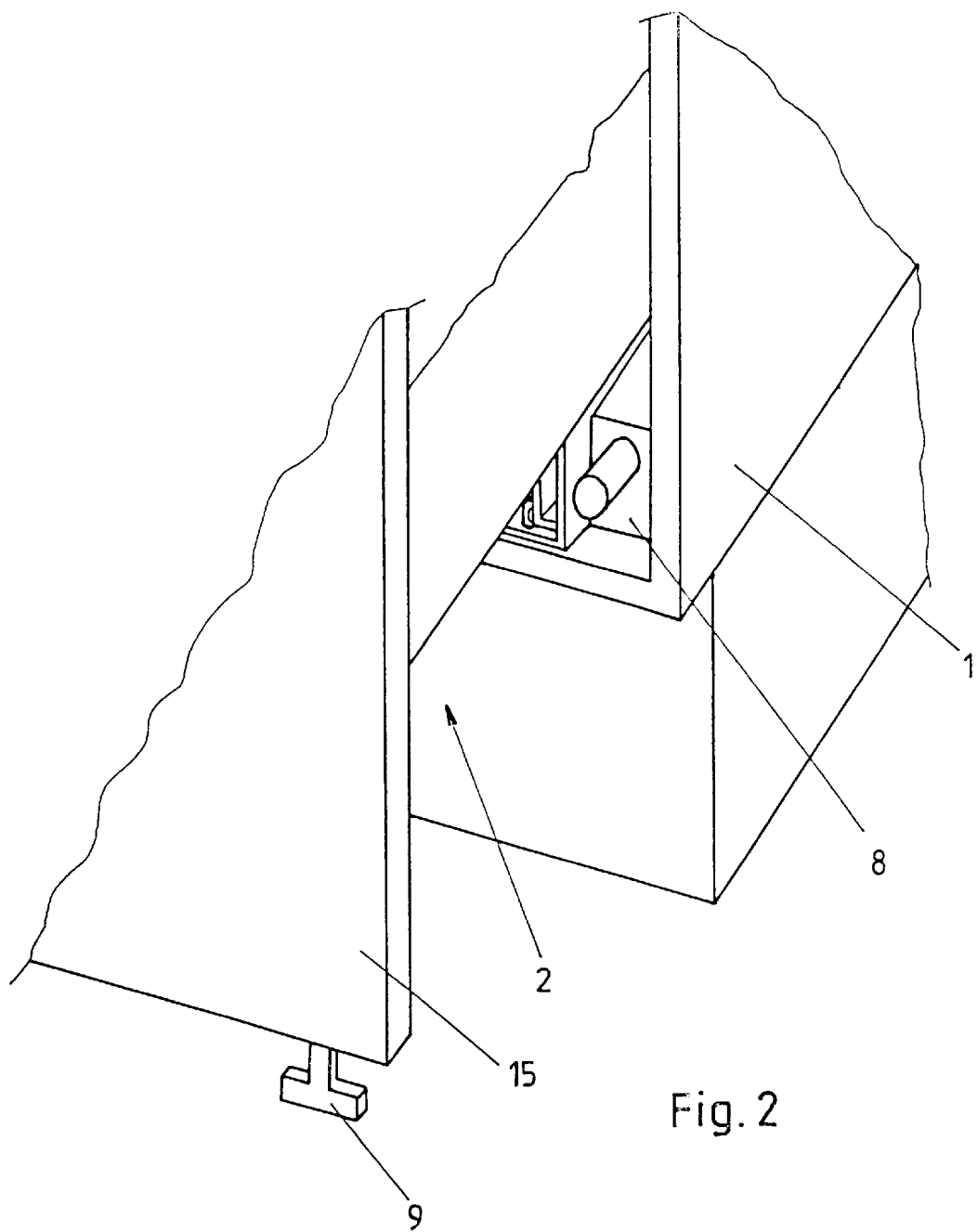
FIG. 2 a partial perspective view of a portion of a motorized tall cupboard according to the present invention in a partially open condition of a drawer at an increased, in comparison with FIG. 1, scale.

A pull-out device according to the present invention can be used, e.g., in a tall cupboard shown in FIG. 1. The tall cupboard shown in FIG. 1 has a housing 1 and a pull-out cupboard section 2 formed as a drawer section. The drawer section 2 can be supported on a differential or telescopic pull-out element e.g., a single central pull-out element can be provided under the bottom of the drawer section. The pull-out element is schematically shown in FIG. 5 and includes a housing rail 3 and a pull-out rail 4 connected with the drawer section 2. A rack 5 is secured to the pull-out rail 4. The rack 5 is displaced or driven by a motor 6 via a pinion 7. In case the pull-out element is formed as a differential element, the rack 5 can be secured to the intermediate rail of the differential pull-out element. The motor 6 is located in the drive housing 8 in which the motor control unit 17 is also located.

For starting and interrupting of the pull-out and drive-in movements of the drawer section or the pull-out element by a user, a switch element is provided which includes an actuation member 9. The actuation member 9 is connected with a light reflector 10 which is displaced longitudinally. In a rest position of the actuation member 9, the reflector 10 is displaced so that its position coinsides with a window 12 formed in the cover 11. In this position, the reflector 10 reflects light from a light source 13 onto a light receiver 14. Both the light source 13 and the light receiver 14 are arranged on a front cover 15 of the adjacent side of the drive housing 8. The actuation member 9 projects beyond the bottom of the front cover 15 and can be actuated with a foot of the user. The light reflector 10 is provided on the inner side of the front cover 15. The light source 13 is advantageously formed as an infra-red light source but also can be formed by a laser diode. The light receiver is adapted to the light emitted by the light source.

When the light, which is reflected by the reflector 10, reaches the light receiver 14, the receiver 14 generates a signal communicated to the switch 16 of the motor control unit 17. The communicated signal changes the condition of the switch 16. The switch 16 has one of the following condition "Pull-out", "Stop," "Drive-In," "Stop," "Pull-out" . . . .

The condition of the switch 16 changes with each actuation of the actuation member 9. The change from the condition "Pull-out" or "Drive-In" and the condition "Stop" is effected with a torque limiting element of the motor control unit 17, e.g., when the front over 15 encounters an obstruction or when the pull-out rail 4 hits one of the stops 18, 19 symbolically shown in FIG. 5. The stops 18, 19 define an end position of the pull-out rail 4 in its drive-in and pull-out positions, respectively.

Figure 6:
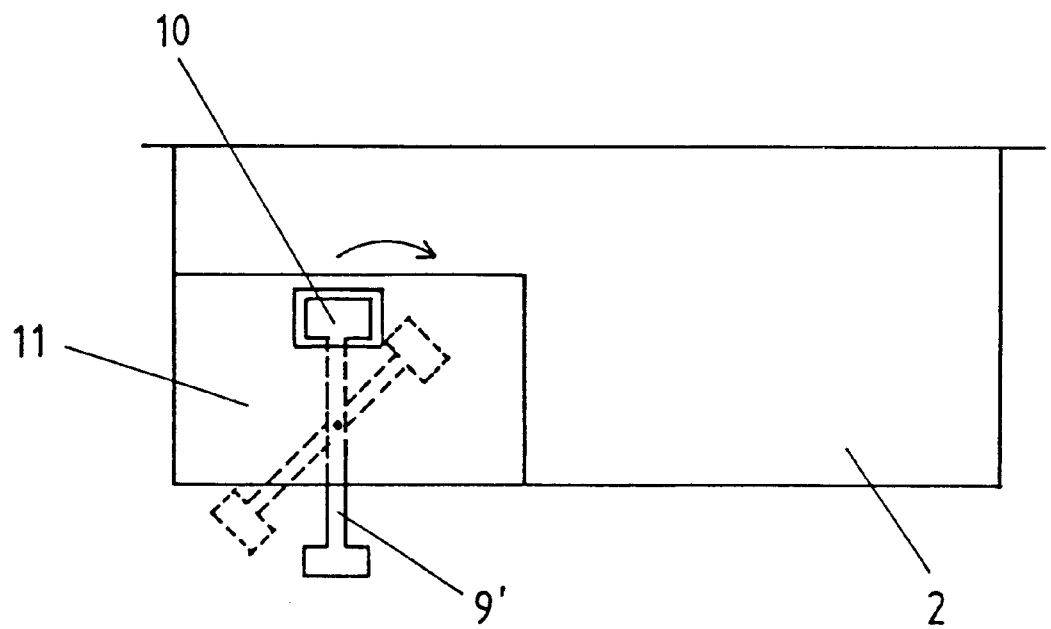
FIG. 6 a view similar to that of FIG. 3 showing a pivotal lever.
Figure 7:
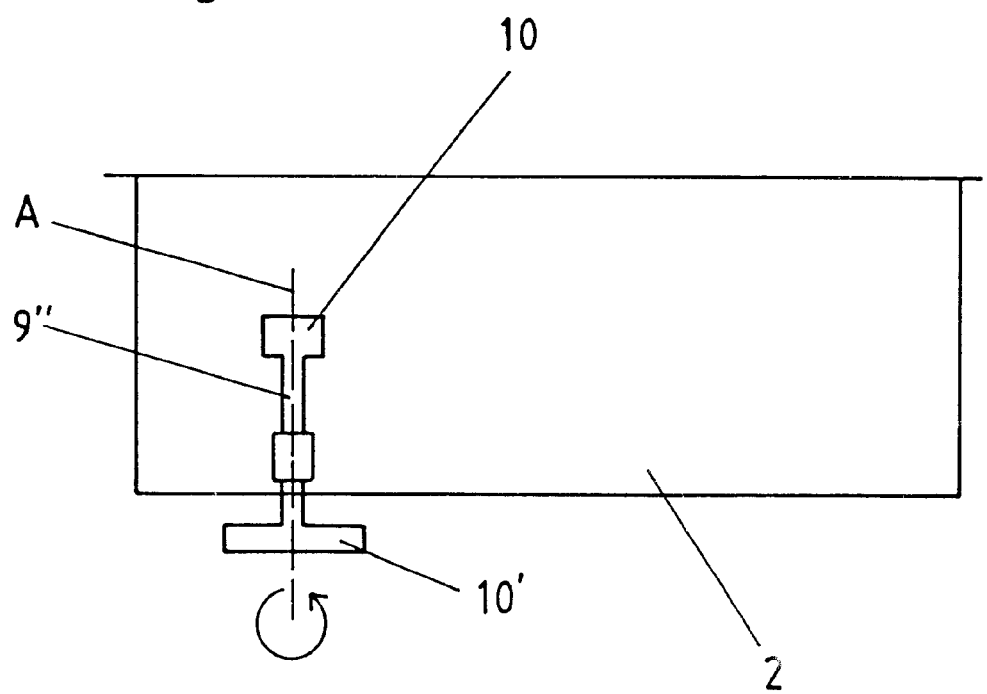
FIG. 7 a view showing an actuation member with a handle for pivoting the light reflector about an axis lying in the plane of the reflector.

Further, it is possible and it is contemplated that upon actuation of the actuation member 9, the switch 16, during pull-out or drive-in of the drawer section, would not change its position to "Stop" but would occupy a position corresponding to a reverse rotational direction of the motor 6. Further, instead of the longitudinally or linearly displaceable actuation member 9, a pivotal lever $9^1$ can be used, as shown in FIG. 6. E.g., with a two-arm lever, the light reflector can be secured to one of the arms. Also, an actuation member $9^{11}$ of the light reflector 10 can be provided with a handle $10^1$ for pivoting the reflector about an axis A lying in the reflector plane, as shown in FIG. 7. In this case likewise, the emitted light can be reflected onto the light receiver by pivotal movement of the reflector about the axis.

Advantageously, the light source 13 and the light receiver 14 control the switch 16 in a pulsed manner, as it takes place in photoelectric carriers, in order to prevent an error function of the switch caused by a stray light beam.

Though the present invention was shown and described with references to the preferred embodiment, such is merely illustrative of the present invention and are not to be construed as a limitation thereof, and various modifications of the present invention will be apparent to those skilled in the art. It is, therefore, not intended that the present invention be limited to the disclosed embodiments or details thereof, and the present invention includes all variations and/or alternative embodiments within the spirit and scope of the present invention as defined by the appended claims.

What is claimed is:

1. A motorized pull-out device for a tall cupboard having a pull-out section, the pull-out device comprising:
   a pull-out rail connected with the pull-out section of the tall cupboard;
   a motor for pulling the pull-out rail out and for driving the pull-out rail in;
   a control unit for controlling operation of the motor;
   a switch for actuating the motor for effecting pulling the pull-out section of the tall cupboard out and driving the pull-out section in; and
   means for actuating the switch and including a light source and a light receiver both associated with a tall cupboard housing, a light reflector for reflecting the light emitted by the light source onto the light receiver and associated with the pull-out section of the tall cupboard, and an actuation member for displacing the light reflector between a first position, in which the light emitted by the light source is reflected by the light reflector onto the light receiver, and a second position in which the light emitted by the light source is not reflected by the light reflector onto the light receiver.

2. A pull-out device as set forth in claim 1, wherein the actuation member displaces the light reflector linearly.

3. A pull-out device as set forth in claim 1, wherein the light reflector is shielded, in the second position thereof, by a cover.

4. A pull-out device as set forth in claim 1, wherein upon initial actuation of the actuation member in a turn-off condition of the motor, the control unit initiates movement of the motor in one direction, upon further actuation of the actuation member, the control units stops the motor, upon still further actuation of the actuation member, the control unit initiates movement of the motor in a direction opposite to the one direction, and upon yet further actuation of the actuation member, the control unit stops the motor again.

5. A pull-out device as set forth in claim 1, wherein the control unit comprises a torque limiting means for stopping the motor when a maximum allowable torque of the motor is exceeded.

6. A motorized pull-out device for a tall cupboard having a pull-out section, the pull-out device comprising:
   a pull-out rail connected with the pull-out section of the tall cupboard;
   a motor for pulling the pull-out rail out and for driving the pull-out rail in;
   a control unit for controlling operation of the motor;
   a switch for actuating the motor for effecting pulling the pull-out section of the tall cupboard out and driving the pull-out section in; and
   means for actuating the switch and including a light source, a light receiver, a light reflector for reflecting the light emitted by the light source onto the light receiver and associated with the pull-out section of the tall cupboard, and an actuation member for displacing the light reflector between a first position, in which the light emitted by the light source is reflected by the light reflector onto the light receiver, and a second position in which the light emitted by the light source is not reflected by the light reflector onto the light receiver, wherein the actuation member is formed as a lever for pivoting the light reflector which is secured to a lever arm.

7. A motorized pull-out device for a tall cupboard having a pull-out section, the pull-out device comprising:
   a pull-out rail connected with the pull-out section of the tall cupboard;
   a motor for pulling the pull-out rail out and for driving the pull-out rail in;
   a control unit for controlling operation of the motor;
   a switch for actuating the motor for effecting pulling the pull-out section of the tall cupboard out and driving the pull-out section in; and means for actuating the switch and including a light source, a light receiver, a light reflector for reflecting the light emitted by the light source onto the light receiver and associated with the pull-out section of the tall cupboard, and an actuation member for displacing the light reflector between a first position, in which the light emitted by the light source is reflected by the light reflector onto the light receiver, and a second position in which the light emitted by the light source is not reflected by the light reflector onto the light receiver, wherein the light reflector pivots about an axis located in a reflector plane.

8. A motorized pull-out device for a tall cupboard having a pull-out section, the pull-out device comprising:

a pull-out rail connected with the pull-out section of the tall cupboard;

a motor for pulling the pull-out rail out and for driving the pull-out rail in;

a control unit for controlling operation of the motor;

a switch for actuating the motor for effecting pulling the pull-out section of the tall cupboard out and driving the pull-out section in; and means for actuating the switch and including a light source, a light receiver, a light reflector for reflecting the light emitted by the light source onto the light receiver and associated with the pull-out section of the tall cupboard, and an actuation member for displacing the light reflector between a first position, in which the light emitted by the light source is reflected by the light reflector onto the light receiver, and a second position in which the light emitted by the light source is not reflected by the light reflector onto the light receiver, wherein the light reflector is mounted on a front cover of the pull-out section, and wherein the actuation member projects beyond a lower edge of the front cover of the pull-out section.

* * * * *